United States Patent [19]
Codama et al.

[11] Patent Number: 5,904,508
[45] Date of Patent: May 18, 1999

[54] SEMICONDUCTOR DEVICE AND A METHOD OF MANUFACTURING THE SAME

[75] Inventors: Mitsufumi Codama, Kanagawa; Michio Arai, Tokyo, both of Japan

[73] Assignees: Semiconductor Energy Laboratory Co., Ltd., Kanagawa; TDK Corporation, Tokyo, both of Japan

[21] Appl. No.: 08/786,188

[22] Filed: Jan. 21, 1997

Related U.S. Application Data

[63] Continuation of application No. 08/533,716, Sep. 26, 1995, abandoned.

[30] Foreign Application Priority Data

Sep. 27, 1994 [JP] Japan ................................. 6-257660

[51] Int. Cl.$^6$ ................................................ H01L 21/265
[52] U.S. Cl. ........................ 438/151; 438/163; 438/299
[58] Field of Search .............................. 437/21, 40, 41, 437/44; 148/DIG. 141; 438/151, 163, 299, 303, 305, 585, 595, 947

[56] References Cited

U.S. PATENT DOCUMENTS

| | | |
|---|---|---|
| 4,160,683 | 7/1979 | Roche ........................... 148/DIG. 141 |
| 4,183,134 | 1/1980 | Oehler et al. . |
| 4,312,680 | 1/1982 | Hsu ................................. 437/41 TFT |
| 4,948,745 | 8/1990 | Pfiester et al. ............................. 437/44 |
| 5,252,502 | 10/1993 | Havemann . |
| 5,314,832 | 5/1994 | Deleonibus ............................... 437/44 |
| 5,391,510 | 2/1995 | Hsu et al. . |
| 5,654,570 | 8/1997 | Agnello . |
| 5,766,991 | 6/1998 | Chen . |

FOREIGN PATENT DOCUMENTS

| | | |
|---|---|---|
| 55-052264 | 4/1980 | Japan . |
| 55-52264 | 4/1980 | Japan ................................. 437/41 SW |
| 61-234567 | 10/1986 | Japan ................................. 437/41 SW |
| 1-158775 | 6/1989 | Japan ............................. 437/40 TFT |
| 2-30145 | 1/1990 | Japan ................................. 437/41 GS |
| 2140617 | 11/1984 | United Kingdom ..................... 437/21 |

OTHER PUBLICATIONS

S. Wolf & R.N. Tauber, "Silicon Processing for the VLSI Era" vol. I, pp. 151–155, 303–305, Aug. 1990.
S. Wolf & R.N. Tauber, "Silicon Processing for the VLSI Era", vol. I, pp. 152–153, 304–305, Aug. 1990.

*Primary Examiner*—Charles Bowers
*Assistant Examiner*—Martin Sulsky
*Attorney, Agent, or Firm*—Sixbey, Friedman, Leedom & Ferguson, P.C.; Gerald J. Ferguson, Jr.

[57] ABSTRACT

Fabrication of TFTs utilizing self-aligned techniques. Although gate electrodes are made of aluminum, source/drain regions can be activated by a heat treatment. Spacers are formed, using dummy gate electrodes. Gate electrodes are defined, using the spacers. Impurity ions are implanted before the gate electrodes are formed. Thus, the source/drain regions, channel formation regions, and offset regions are formed in a self-alignment manner, using the dummy gate electrodes and the spacers as masks. Since the heat treatment is made before the formation of the gate electrodes, the gate electrodes can be formed from aluminum having a low melting point.

13 Claims, 8 Drawing Sheets

SEMICONDUCTOR DEVICE AND A METHOD OF MANUFACTURING THE SAME

This application is a Continuation of Ser. No. 08/533,716, filed Sep. 26, 1995, now abandoned.

BACKGROUND OF THE INVENTION

1. Field of the Invention

The present invention relates to a thin-film transistor (TFT) structure used in solid-state image sensors and liquid crystal displays and also to a method of fabricating such TFTs. Furthermore, the invention relates to MOS transistors used in an LSI and to a method of fabricating such MOS transistors.

2. Description of the Related Art

In recent years, commercial products whose performance has been improved by packing TFTs into large-sized devices have been put into the market. Also, commercial products which have been miniaturized by simplification of peripheral circuits have appeared on the market. Especially, small-sized personal computers which have started to be widespread since around 1990 and are known as notebook computers and laptop computers have large-sized liquid crystal displays. Of these large-sized liquid crystal displays, active matrix liquid crystal displays in which a TFT is disposed at each pixel have very excellent display performance. There is an urgent demand for reductions in costs of these active matrix liquid crystal displays.

Today, almost all manufactured TFTs used in these large-sized liquid crystal displays use amorphous silicon. However, amorphous TFTs exhibit lower performance compared with other transistors. For example, with respect to electron mobility, the electron mobility of an amorphous TFT is $10^{-4}$ to $10^{-3}$ times as high as the electron mobility of a single-crystal silicon transistor. Therefore, an IC forming a peripheral driver circuit for driving TFTs disposed at pixels is required to be disposed outside, the IC being made from single-crystal silicon.

Furthermore, in order to obtain a sufficiently high operating speed by supplying a sufficiently large current into TFTs disposed at pixels, it is necessary to set the channel width to a large value. This reduces the pixel aperture ratio which is one of factors capable of enhancing the display quality. In this way, these two parameters conflict with each other. Moreover, with respect to reliability, amorphous silicon film and amorphous silicon nitride film are electrically unstable intrinsically. Consequently, their long-term performance is not ensured.

A method of fabricating TFTs from polysilicon is expected to act as means for solving all of these disadvantages. In this method, ON currents which are higher than the ON currents of amorphous silicon TFTs by two or three orders of magnitude are obtained. Additionally, instability as encountered in amorphous silicon TFTs does not take place but rather excellent reliability is obtained. Moreover, both N-type and N-type transistors can be fabricated. Consequently, CMOS circuits can be built. It is easy to satisfy the present demand for lower electric power consumption.

Where TFTs are formed from this polysilicon, the peripheral driver circuit for driving TFTs disposed at pixels of an active matrix liquid crystal display can be made up of TFTs similar to the TFTs disposed at the pixels, because TFTs using a polysilicon thin film can have electrical characteristics and mobilities sufficient to construct the peripheral driver circuit.

Although the polysilicon TFTs have excellent properties in this way, their OFF current is high. Also, when a gate voltage is applied to the reverse bias side (in the case of an N-type TFT, the voltage is applied to the negative side; in the case of a P-type TFT, the voltage is applied to the positive side), the current is increased. In this manner, there remain numerous drawbacks to be solved. The OFF current referred to herein is the electrical current flowing between the source and drain at the point at which the TFT is driven into cutoff. For example, in the case of the N-channel type, this point is normally set to 0 V or more.

It is known that these problems (i.e., high OFF currents and increased current on the reverse bias side) can be circumvented by forming an offset structure or LDD (lightly doped drain) structure on the side of the drain electrode.

The offset structure is described in Japanese Patent Laid-Open No. 360580/1992 (hereinafter referred to as Reference 1). The LDD structure is described in Japanese Patent Publication No. 38755/1991 (hereinafter referred to as Reference 2), in "Submicron Device II", Electronic Material Series, 3rd print, published by Maruzen Publishing Company, Japan, Sep. 5, 1993, p. 187 (hereinafter referred to as Reference 3), and in "Ultrahigh-Speed MOS Devices", Ultrahigh-Speed Digital Device Series, Published by Baifukan Publishing Company, Japan, 1st print, Feb. 10, 1986, p. 151 (hereinafter referred to as Reference 4).

In these offset structure and LDD structure, the concentration of electric field between the drain region and the channel formation region is mitigated to lower the OFF current. Also, increase of current on the reverse side is suppressed.

Known methods of forming the LDD structure are described in References 3 and 4. In particular, after patterning gate electrodes, a silicon oxide film is formed by a film formation method which provides good step coverage. An etch-back step is performed by a highly anisotropic method. Side walls or spacers are formed beside the side surfaces of the gate electrodes. These side walls will act as a mask during doping.

In these methods, those portions which are located under the side walls or spacers are lightly doped with impurity ions to change these regions into field mitigation regions. In these methods, materials capable of withstanding high temperatures such as $n^+$ polysilicon (n-type silicon having crystallites) and silicides are used to form gate electrodes, for the following reason. After completion of implantation of impurity ions for forming source/drain regions, a heat treatment is conducted above 500° C. to anneal out damage to the active layer induced during the impurity ion implantation (generally, regions implanted with ions are made amorphous) and to activate the implanted impurity ions.

However, the polysilicon has a large internal stress and so where gate electrodes are formed from the polysilicon, the stress inside the gate electrodes is transmitted to the gate-insulating film and also to the channel formation region. Consequently, the electrical characteristics of the TFTs are affected. This causes the individual TFTs to have characteristics different from each other and induces instability, thus producing undesirable results.

On the other hand, gate electrodes are preferably made from a material having a low resistivity. Ever finer gate electrodes have been developed. Where miniaturization and larger scales of integration are taken into, consideration, it is required to use a material having the lowest sheet resistivity achievable. Gold, silver, copper, aluminum, and other materials are available as low-resistivity materials. However, gold and silver are expensive. Copper has the disadvantage that it diffuses during a heating step. Therefore, these metals are inappropriate. On the other hand, aluminum is cheap and has a small internal stress. Therefore, aluminum is a quite desirable material for forming gate electrodes.

SUMMARY OF THE INVENTION

Generally, self-aligned techniques are adopted during fabrication of polysilicon TFTs, as described in References 1, 3, and 4. After formation of gate electrodes, impurity ions for imparting one conductivity type are introduced by ion implantation, using the gate electrodes as a mask. In this way, self-aligned source and drain regions are formed.

However, in the self-aligned techniques, the source and drain regions are amorphized by the bombardment of implanted ions. Accordingly, some annealing step is necessary to crystallize the amorphized source and drain regions and to activate the implanted impurity ions. A method using a heat treatment or laser irradiation is employed as this annealing step. The method relying on the heat treatment can provide the greatest effect stably. Where characteristics and stability of TFTs are taken into account, it can be said that this is the best method.

Where the method using the heat treatment is adopted, if the characteristics of the finished TFTs and variations in characteristics among the TFTs are taken into account, it is necessary to set the heating temperature to the highest temperature achievable. Generally, the lowest heating temperature is 600° C. Preferably, the heating temperature is set above 800° C. Generally, the upper limit of the heating temperature is restricted by the melting point of silicon or the maximum processing temperature of the substrate.

However, aluminum can stand up to high temperatures exceeding 500° C. only for a short time. The required heating temperature is in excess of the maximum processing temperature of aluminum. This is an impediment to forming gate electrodes from aluminum. For example, where gate electrodes are made from aluminum and a heat treatment is performed at 550° C. during activation of source and drain regions, aluminum diffuses into the gate-insulating film and even into the active layer. The result is that the operation of the thin-film transistors is hindered.

Because of these problems, it has been difficult to fabricate TFTs having gate electrodes which are formed from aluminum in a self-alignment manner. That is, impurity ions are implanted, using the gate electrodes as a mask, to form source/drain regions.

Furthermore, TFTs having the offset structure or LDD structure are based on self-aligned techniques and, therefore, it is more difficult to form TFTs which have the offset structure or LDD structure and in which gate electrodes are made from aluminum.

The foregoing problems are not limited to TFTs. The same problems occur in ordinary IC fabrication techniques. Specifically, where MOS transistors having gate electrodes made of aluminum are formed on a silicon wafer, the heat resistance of aluminum presents problems in fabrication steps involving heating. Hence, it is difficult to utilize the self-aligned techniques. These are summarized as follows:

(1) Aluminum is a material best suitable as the material forming the gate electrodes of MOS transistors.

(2) However, aluminum has low heat resistance and so it is difficult to perform required heat treatments. Therefore, where gate electrodes are formed from aluminum, it is difficult to utilize the self-aligned techniques.

(3) The characteristics of polycrystalline thin-film transistors can be further enhanced by adopting the offset structure or the LDD structure. Since these offset structure and LDD structure essentially use the self-aligned techniques, if aluminum is used to form the gate electrodes, it is difficult, of course, to adopt the self-aligned techniques.

It is an object of the present invention to provide equipment for fabricating semiconductor devices in such a way that the foregoing problems (1)–(3) are solved and that at least one of the following items (a)–(c) is satisfied.

It is another object of the invention to provide a method of fabricating semiconductor devices in such a way that the foregoing problems (1)–(3) are solved and that at least one of the following items (a)–(c) is satisfied.

(a) Insulated-gate field-effect transistors having low OFF currents are obtained.

(b) Insulated-gate field-effect transistors are obtained in each of which only a small electrical current flows between the drain and source electrodes when a reverse bias gate voltage is applied.

(c) Insulated-gate field-effect transistors which have gate electrodes consisting only or mainly of aluminum and which have the offset structure or LDD structure are obtained.

The insulated-gate field-effect transistors described in these items are not limited to MOS and MIS TFTs formed on insulating substrates but include MOS and MIS transistors formed on silicon wafers.

The foregoing problems are solved by the present invention. One embodiment of the invention lies in insulated-gate field-effect transistors which comprise: spacers made from an insulator; and gate electrodes whose peripheries are defined by the spacers. In other words, the gate electrodes are formed in the regions defined by the spacers made from an insulator.

Examples of TFTs showing this construction are shown in FIGS. 1(A)–4(D), where spacers 112 and 113 are made from silicon oxide that is an insulator. The positions of gate electrodes 123 and 124 are determined or defined by the spacers 112 and 113, respectively.

In the TFT fabrication process sequence illustrated in FIGS. 3(A)–3(D), in order to define the gate electrodes 123 and 124, the spacers 112 and 113 are formed before the gate electrodes 123 and 124 are formed. Then, a conductive film 122 is formed. In the illustrated example, the film 122 is made of aluminum. Thus, the gate electrodes 123 and 124 are formed in recesses 125 and 126, respectively, in a self-alignment manner by the action of the spacers 112 and 113, respectively.

Another embodiment of the invention lies in insulated-gate field-effect transistors which comprise: an insulator provided with recesses; and a conductive film which covers said recesses and which acts as gate electrodes at bottoms of said recesses.

A specific example of this construction is shown in FIGS. 3(A)–3(D). At the step shown in FIG. 3(B), an insulator, or silicon oxide, is provided with recesses 125 and 126. At the step shown in FIG. 3(C), the conductive film 122 is formed from aluminum. Those portions of the conductive film 122 which are located on the opposite sides of gate-insulating films 105 and 106, respectively, from channel formation regions 116 and 117, respectively, act as gate electrodes at the bottoms of the recesses 125 and 126, respectively. These regions acting as the gate electrodes are determined in a self-alignment manner because of the presence of the spacers 112 and 113. Consequently, the accuracy of the patterning for forming the gate electrodes as shown in FIG. 3(D) does not affect the determination of the regions acting as the gate electrodes.

A further embodiment of the invention lies in an insulated-gate field-effect transistor which comprises: a gate-insulating film formed on an active layer or on an active region; spacers formed on said gate-insulating film and made from an insulator, a conductive film formed on said spacers, said spacers being provided with a recess at their bottoms, said gate-insulating film being exposed in said recess, said conductive film acting as a gate electrode at the bottoms of said recesses.

Another embodiment of the invention lies in an insulated-gate field-effect transistor which comprises: a gate-insulating film formed on an active layer or on an active region; spacers formed on said gate-insulating film and made from an insulator, a conductive film formed over said spacers, said spacers being provided with a recess at their bottoms, said gate-insulating film being exposed in said recess, said conductive film acting as a gate electrode at the bottoms of said recesses.

A yet other embodiment of the invention lies in a method of fabricating a semiconductor device, the method comprising the steps of: forming a convex region; forming spacers from an insulator on side surfaces of said convex region; removing said convex region; and forming a gate electrode in a region defined by said spacers.

A specific example of this method is illustrated in FIGS. 1(A)–4(D). First, at the step shown in FIG. 1(E), convex regions 108 and 109 are formed from polysilicon on gate-insulating films 105 and 106, respectively. As shown in FIGS. 2(A)–2(D), spacers 112 and 113 are formed from an insulator (silicon oxide) on the side surfaces of the convex regions 108 and 109, respectively. In the illustrated example, a silicon nitride film 110 is inserted between the side surfaces of the convex region 108 and the spacer 112 and between the side surfaces of the convex region 109 and the spacer 113.

In the step shown in FIG. 3(B), the convex regions 108 and 109 are removed. At the same time, the exposed silicon nitride film 110 is removed. Then, a conductive film 122 is formed from aluminum. The remaining spacers 112 and 113 define recesses 125 and 126, respectively. Regions acting as gate electrodes are formed at the bottoms of the recesses 125 and 126, respectively.

The convex regions 108 and 109 finally define the regions of the gate electrodes and act as dummy gate regions during the fabrication process.

A still other embodiment of the invention lies in a method of fabricating semiconductor devices, the method comprising the steps of: forming an active layer or an active region having a gate-insulating film thereon; forming a convex region on said gate-insulating film; forming spacers from an insulator on side surfaces of said convex region; implanting impurity ions into said active layer or active region, using said convex region and said spacers as masks; conducting a heat treatment; removing said convex region; and forming a gate electrode in a region defined by said spacers.

A yet further embodiment of the invention lies in a method of fabricating semiconductor devices, the method comprising the steps of: forming an active layer or an active region having a gate-insulating film thereon; forming a convex region on said gate-insulating film; implanting impurity ions into said active layer or active region, using said convex region as a mask; forming spacers from an insulator on side surfaces of said convex region; implanting impurity ions into said active layer or active region, using said convex region and said spacers as a mask; performing a heat treatment; removing said convex region; and forming a gate electrode in a region defined by said spacers.

A yet additional embodiment of the invention lies in a method of fabricating a semiconductor device, the method comprising the steps of: forming an active layer or active region having a gate-insulating film thereon; forming a convex region on said gate-insulating film; forming spacers from an insulator on side surfaces of said convex region; implanting impurity ions into said active layer or active region, using said convex region and said spacers as a mask; performing a heat treatment at a temperature which is higher than 600° C. and lower than melting point of silicon; removing said convex region; and forming a gate electrode from a material consisting only or mainly of aluminum in a region defined by said spacers.

In these methods, the spacers are formed on the side surfaces of the gate region in conformity with the dummy gate region in a self-alignment manner. The source/drain regions and the channel formation region are formed in a self-alignment manner, using the spacers and the dummy gate region. After the formation of the source/drain regions which need a heat treatment at a high temperature, the gate electrode is formed in conformity with the spacers in a self-alignment manner. In consequence, the gate electrode can be formed from a material having a low sheet resistivity such as aluminum and a material consisting mainly of aluminum.

Specifically, the spacers are formed, using the dummy gate region. Using the dummy gate regions and the spacers as masks, ions are implanted. Then, a heat treatment is performed. Source/drain regions are formed, followed by removal of the dummy gate region. A new gate electrode is formed. In this way, the gate electrode can be fabricated from a material which cannot withstand the high temperature used by the heat treatment conducted after the ion implantation.

For example, where the heat treatment is performed above 600° C., a material which diffuses to the surroundings such as aluminum can be used as the material of the gate electrode.

Furthermore, self-aligned offset regions can be formed, using the spacers described above. In addition, self-aligned, lightly doped regions can be formed, using the dummy gate region and the spacers.

Other objects and features of the invention will appear in the course of the description thereof, which follows.

DETAILED DESCRIPTION OF THE PREFERRED EMBODIMENTS

Steps for manufacturing TFTs according to the present invention are described with reference to the accompanying drawings.

EXAMPLE 1

Figure 1A:
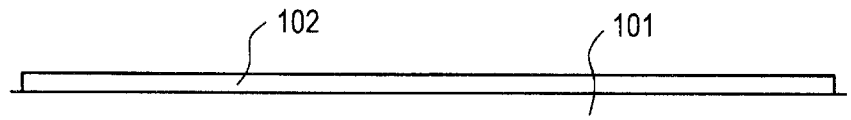
FIGS. 1(A)–1(F) are cross sections illustrating manufacturing steps of Example 1 of the present invention, for fabricating TFTs.
Figure 1B:
Figure 1C:

FIGS. 1(A)–1(F), 2(A)–2(E), 3(A)–3(D), and 4(A)–4(D) illustrate steps for manufacturing TFTs of Example 1 of the novel method. Described in Example 1 are TFTs having LDD (lightly doped drain) regions. First, an amorphous silicon film 102 is formed to a thickness of 1500 Å on a quartz substrate 101 by LPCVD or plasma-assisted CVD (FIG. 1(A)).

If necessary, before the formation of the amorphous silicon film 102, a silicon nitride film or a silicon oxide film may be formed to prevent diffusion of contaminants from the substrate. Instead of the quartz substrate 101, a substrate made of glass or a ceramic such as alumina and having an insulating surface and a semiconductor substrate such as a silicon wafer or a polysilicon substrate on which an insulating film such as a silicon oxide film is formed can be employed.

Then, the amorphous silicon film 102 is heated at 600° C. for about 8 to 24 hours in a nitrogen ambient to grow crystals by solid-phase growth. The resulting polysilicon active layer is patterned into islands to form active layers 103 and 104 of TFTs (FIG. 1(B)).

Thereafter, silicon oxide films 105 and 106 are formed to a thickness of 1000 Å by a thermal oxidation process. In this example, the laminate is thermally oxidized at a temperature of 1000° C. in an oxidizing ambient to form silicon oxide films 105 and 106 on the surfaces of the active layers 103 and 104, respectively. These silicon oxide films 105 and 106 become gate-insulating films of TFTs, respectively.

In this example, the silicon oxide films 105 and 106 are formed by a high-temperature thermal oxidation process. Where a glass substrate is used, a thermal oxidation process performed at around 500° C. and a method of forming silicon oxide films by a CVD process are combined to form gate-insulating films (FIG. 1(C)).

Figure 1D:

Subsequently, a polysilicon film 107 is formed to a thickness of about 3000 Å by LPCVD (FIG. 1(D)). Although the film 107 is made of polysilicon, any other material may be used instead as long as the material does not contaminate the transistors and can withstand the process temperatures used until the thin films formed at this step are removed.

This polysilicon film 107 is patterned to leave island regions to form offset regions and dummy gate regions 108 and 109 which are used to form source/drain regions in a self-alignment manner. The dummy gate regions 108 and 109 determine channel formation regions of TFTs (FIG. 1(E)).

Figure 1E:
Figure 1F:
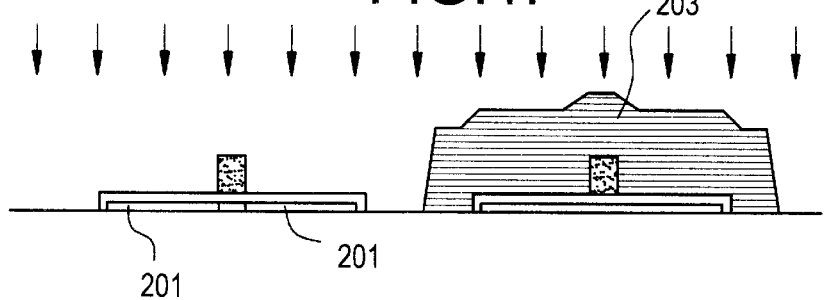

At the step illustrated in FIG. 1(F), the right P-channel TFT region is masked with resist 203 and phosphorus ions are implanted at a density of $1 \times 10^{15}$ to $1 \times 10^{18}$ atoms/cm$^3$. In this way, lightly doped, self-aligned regions 201 are formed.

Figure 2A:
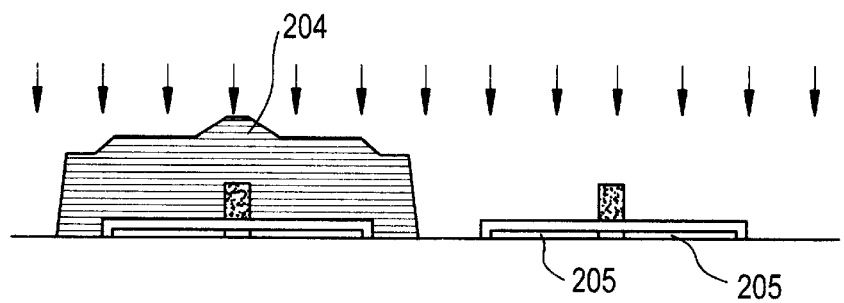
FIGS. 2(A)–2(E) are cross sections illustrating manufacturing steps of Example 1, for fabricating TFTs.
Figure 2B:
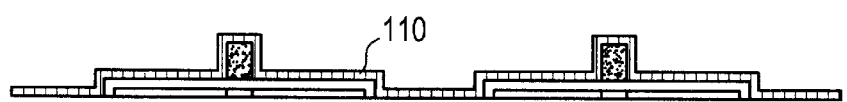
Figure 2C:
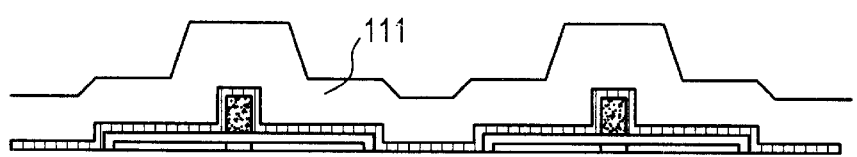

Then, at the step illustrated in FIG. 2(A), the left N-channel TFT region is masked with resist 204 and boron ions are implanted at a density of $1 \times 10^{15}$ to $1 \times 10^{18}$ atoms/cm$^3$. In this way, lightly doped, self-aligned regions 205 are formed.

At the steps shown in FIGS. 1(F) and 2(A), it is important that lightly doped, self-aligned regions 201 and 205 be formed while the dummy gate regions 108 and 109 are used as masks. The concentrations of the impurities in the lightly doped regions 201 and 205 may be determined according to the manner in which the present invention is practiced.

Then, a silicon nitride film 110 is formed to a thickness of about 300 Å by plasma-assisted CVD. This silicon nitride film 110 will act as an etch stopper when the silicon oxide films are etched later (FIG. 2(B)).

Thereafter, a silicon oxide film 111 is formed to a thickness of about 3000 Å to 1 μm by a method with good step coverage such as atmospheric-pressure CVD. This silicon oxide film 111 is used to form side walls or spacers which will act as masks during formation of offset regions (FIG. 2(C)).

Thereafter, the silicon oxide film 111 is etched back by a method capable of anisotropic etching such as an RIE process. That is, the silicon oxide film 111 is etched by an etching process having vertical anisotropy. It is to be noted that during this etch-back process, etching conditions are so selected that the etching terminates in the silicon nitride film 110. Specifically, the silicon nitride is etched at a rate sufficiently lower than the rate at which the silicon oxide film 111 is etched. More specifically, the silicon oxide film 111 can be selectively etched, using $CHF_3$ or mixed gas of $CF_4$ and $H_2$ as an etchant gas (FIG. 2(D)).

Alternatively, a dry etching process may be terminated, leaving a quite small thickness (e.g., about 500 Å) of the silicon oxide film 111. The remaining silicon oxide thin film 111 is removed with buffered HF solution.

Figure 2D:
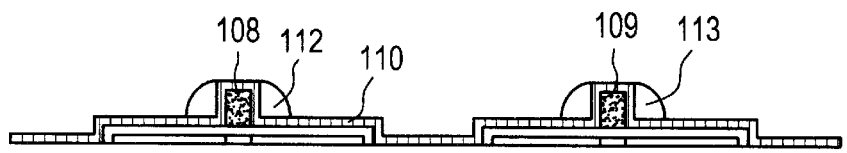
Figure 2F:
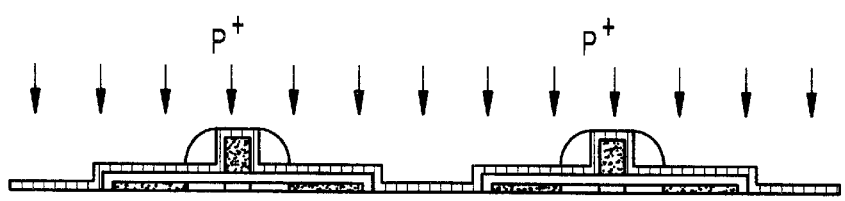

By vertically etching the silicon oxide film 111, spacers or side walls 112 and 113 of silicon oxides are formed on the side surfaces of the dummy gate regions 108 and 109 (FIG. 2(D)).

Then, a heavily doped layer is formed to make contacts with interconnection electrodes. In other words, source/drain regions of TFTs are formed. In this example, phosphorus ions are first implanted at an accelerating voltage of 60 kV and at a dose of $1 \times 10^{15}$ atoms/cm$^2$ (FIG. 2(E)).

Thereafter, the left TFT region which will become an N-channel TFT is coated with resist 301. Boron ions are implanted into the right region becoming a P-channel TFT, at an accelerating voltage of 40 kV and at a dose of $5 \times 10^{15}$ atoms/cm$^2$ (FIG. 3(A)).

Figure 3A:
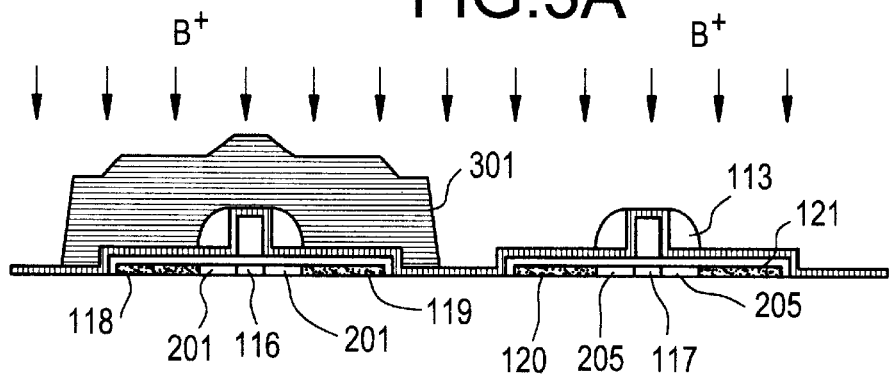
FIGS. 3(A)–3(D) are cross sections illustrating manufacturing steps of Example 1, for fabricating TFTs.

At the impurity ion implantation steps shown in FIGS. 2(E) and 3(A), the dummy gate regions 108, 109 and the spacers 112, 113 act as masks. As a result, source regions 118, 120, drain regions 119, 121, lightly doped regions 201, 205, and channel formation regions 116, 117 are formed in a self-alignment manner. Those portions of the lightly doped regions 201 and 205 which are located on the sides of the drain regions 119 and 121 are lightly doped drain (LDD) regions.

The silicon nitride film 110 and the dummy gate regions 108 and 109 made of polysilicon are removed under such dry etching conditions that none of the spacers 112 and 113 made of silicon oxide are damaged. For example, mixed gas of $SF_6$ and $O_2$ is used as an etchant gas, and a plasma etching process is performed (FIG. 3(B)).

Figure 3B:

A method for obtaining the state shown in FIG. 3(B) may also consist of first removing the silicon nitride film 110 exposed on the surface with phosphoric acid heated at about 180° C. and then removing the dummy gate regions 108 and 109.

After obtaining the state shown in FIG. 3(B), the laminate is annealed at a temperature of 850° C. for 1 hour to activate the impurities implanted at the steps of FIGS. 2(E) and 3(A) and to anneal out the damage to the active layer. The upper limit of the heating temperature during this step is determined by the melting point of silicon or the maximum processing temperature of the substrate. The sheet resistance of the source/drain regions obtained by the manufacturing steps of the present example is approximately 100 to 600 Ω/square.

Figure 3C:
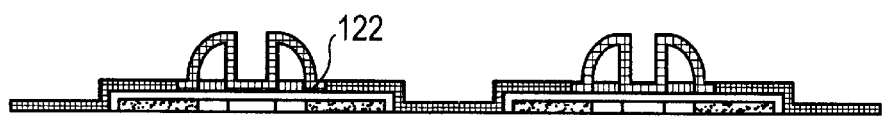

Then, an aluminum film 122 is formed to a thickness of 3000 Å by electron-beam evaporation or other method (FIG. 3(C)).

The aluminum film 122 is patterned to form gate electrodes 123 and 124. At this time, the gate electrodes 123 and 124 are preferably formed only in recesses 125 and 126 where the gate electrodes are to be formed, the recesses 125 and 126 being defined by the spacers 112 and 113, respectively (FIG. 3(D)).

However, there arises an actual problem that regions 127 and 128 are left because of limited patterning accuracy. These regions 127 and 128 are impediments to RF operation of TFTs. However, when ordinary liquid crystal displays are driven, even if the regions 127 and 128 exist, no problems occur.

Since the patterning step for forming these gate electrodes 123 and 124 do not determine regions which act as gate electrodes, there is the advantage that the process margin can be increased. That is, the regions acting as the gate electrodes are bottoms of the recesses 125 and 126 formed by the spacers 112 and 113, respectively. These regions are determined by the presence of the spacers 112 and 113, respectively. Therefore, the accuracy of the patterning for forming the gate electrodes does not affect the determination of the regions which act as the gate electrodes and which determine the size of channel formation regions.

Figure 3D:
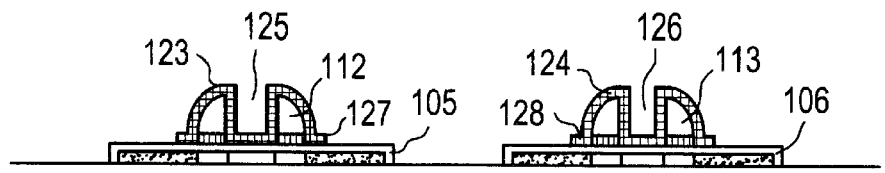

It is important for the state shown in FIG. 3(D) that the gate electrodes 123 and 124 can be formed by the action of the spacers 112 and 113 in a self-alignment manner. The spacers 112 and 113 serve to form self-aligned source regions 118 and 120 and self-aligned drain regions 119 and 121 at the steps shown in FIGS. 2(E) and 3(A). Furthermore, at the step shown in FIG. 3(D), the spacers act to form the gate electrodes 123 and 124 in a self-alignment manner.

After obtaining the state shown in FIG. 3(D), a silicon oxide film is formed as an interlayer dielectric film 129 to a thickness of 8000 Å by atmospheric-pressure CVD. The laminate is annealed at 350° C. in a hydrogen ambient to improve the electrical characteristics of the TFTs (FIG. 4(A)).

Figure 4A:
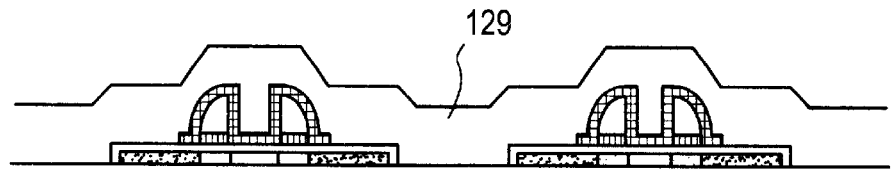
FIGS. 4(A)–4(D) are cross sections illustrating manufacturing steps of Example 1, for fabricating TFTs.
Figure 4B:
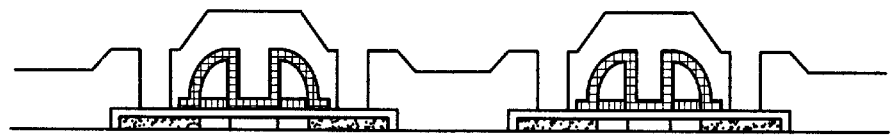

Then, contact holes are formed with a solution prepared by adding acetic acid to buffered hydrofluoric acid (FIG. 4(B)).

Figure 4C:
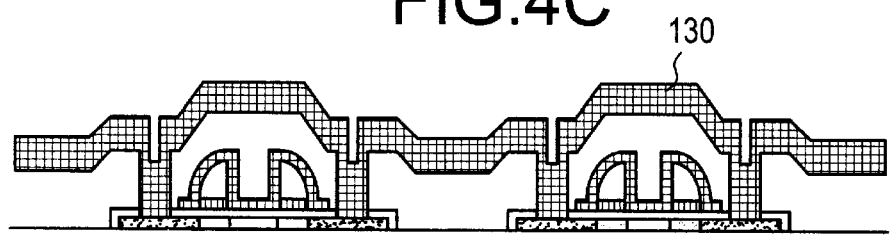
Figure 4D:
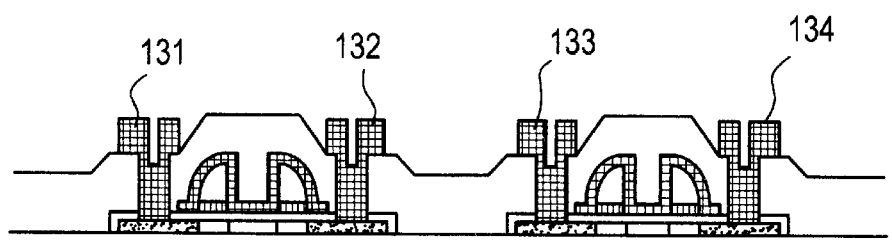

Thereafter, a metallization film 130 is formed from aluminum (FIG. 4(C)).

Finally, the aluminum film is patterned and sintered at 300° C. for 1 hour to form a source electrode 131 and a drain electrode 132 for an N-channel TFT and a source electrode 133 and a drain electrode 134 for a P-channel TFT, thus completing TFTs of the present example.

In the steps for manufacturing the TFTs of the present example, the gate electrodes 123 and 124 consisting only or mainly of aluminum are formed after formation of the source/drain regions which needs a high temperature of 500° C. , preferably above 600° C. Consequently, the heat treatment for forming the source/drain regions to obtain high characteristics is compatible with the formation of the gate electrodes consisting only or principally of aluminum which is vulnerable to heat.

Besides the items described above, the positions of the source/drain regions, the channel formation region, and the offset regions are all determined by the dummy gate regions formed at the step illustrated in FIG. 1(E) in a self-alignment manner.

In the present example, a silicon oxide film is used as the material of the spacers 112 and 113. Obviously, the requirement is only that the spacers are dielectric films. Furthermore, the method of forming the spacers is not limited to CVD or sputtering. For example, SOG (spin-on-glass) and anodization may also be exploited.

EXAMPLE 2

The present example is similar to the configuration of Example 1 except that the lightly doped regions are replaced by undoped regions to obtain TFTs having offset regions.

The process sequence of the present example is illustrated in FIGS. 5(A)–8(B). It is to be noted that like components are indicated by like reference numerals in various figures. The process sequence is briefly described below. The fabrication conditions, the film thicknesses, and other parameters are the same as those used in Example 1 unless otherwise stated specifically.

Figure 5A:
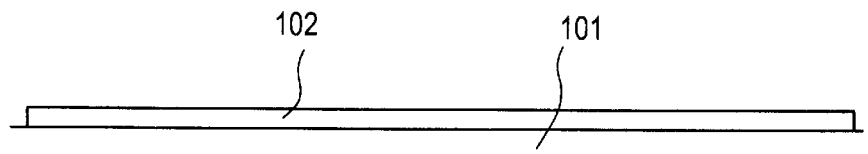
FIGS. 5(A)–5(F) are cross sections illustrating manufacturing steps of Example 2 of the present invention, for fabricating TFTs.
Figure 5B:
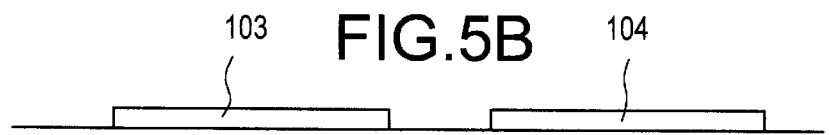
Figure 5C:
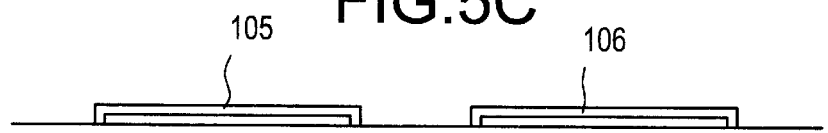

First, as shown in FIG. 5(A), an amorphous silicon film 102 is formed on a quartz substrate 101. This film is crystallized by a heat treatment. Then, as shown in FIG. 5(B), active layers 103 and 104 of TFTs are formed by patterning. Thereafter, as shown in FIG. 5(C), silicon oxide films 105 and 106 which will act as gate-insulating films are formed on the surfaces of the active layers 103 and 104, respectively.

Figure 5D:
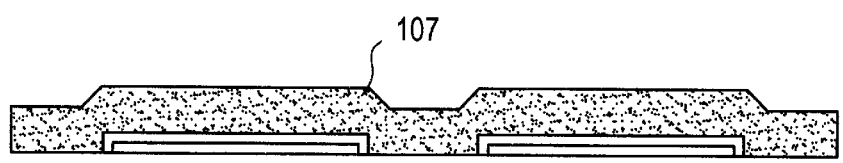
Figure 5E:
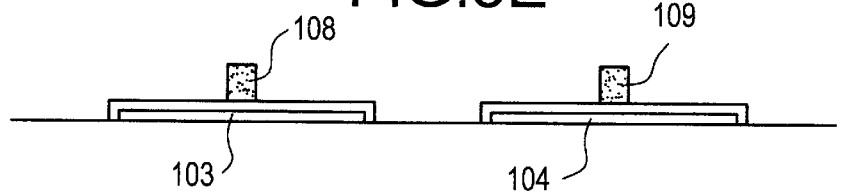
Figure 5F:
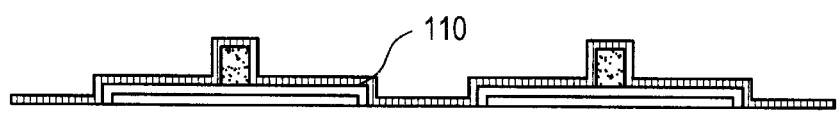

As shown in FIG. 5(D), a polysilicon film 107 is formed to form dummy gate regions. The polysilicon film 107 is patterned to form dummy gate regions 108 and 109, as shown in FIG. 5(E). Then, as shown in FIG. 5(F), a silicon nitride film 110 is formed. This film 110 will act as an etch stopper in a step conducted later.

Figure 6A:
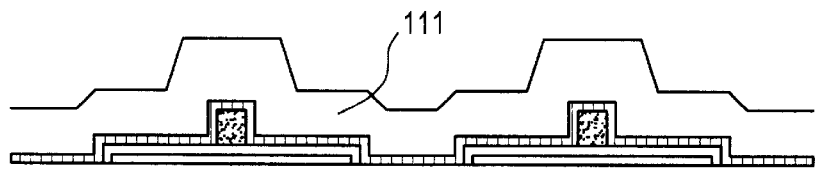
FIGS. 6(A)–6(E) are cross sections illustrating manufacturing steps of Example 2, for fabricating TFTs.
Figure 6B:
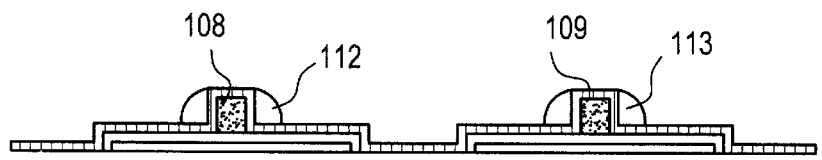

In order to form spacers 112 and 113 (FIG. 6(B)) on the side surfaces of the dummy gate regions, a silicon oxide film 111 is formed as shown in FIG. 6(A). This film is then etched by an etching process having vertical anisotropy such as an RIE process. Subsequently, as shown in FIG. 6(B), spacers 112 and 113 are formed from silicon oxide over the side surfaces of the dummy gate regions 108 and 109, respectively, via the silicon nitride film 110.

Figure 6C:
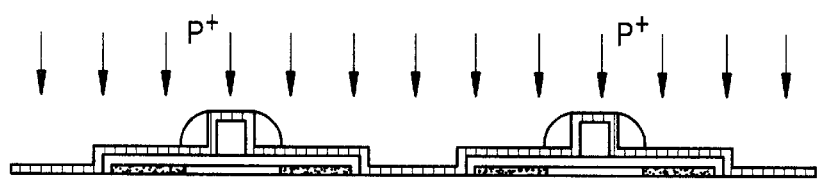
Figure 6D:
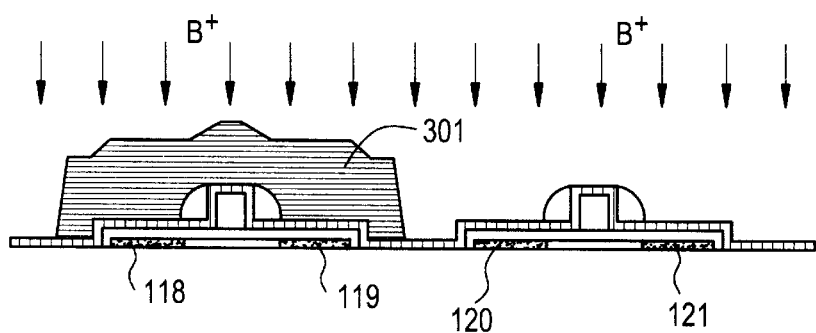

After obtaining the state shown in FIG. 6(B), phosphorus ions are implanted as shown in FIG. 6(C). As shown in FIG. 6(D), a mask 301 is formed from resist, followed by implantation of boron ions. The laminate is heat-treated to activate and recrystallize the regions 118–121 doped with the impurity ions. In this way, the source region 118 and the drain region 119 for the left N-channel TFT and the source region 120 and the drain region 121 for the right P-channel TFT are formed.

Figure 6E:
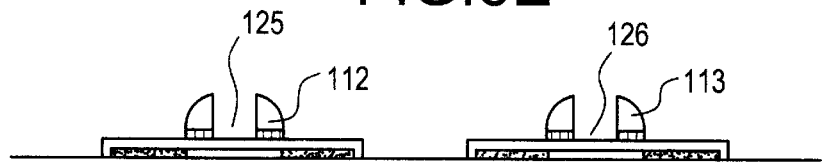
Figure 7A:
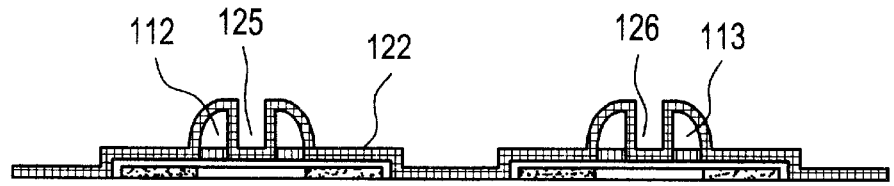
FIGS. 7(A)–7(D) are cross sections illustrating manufacturing steps of Example 2, for fabricating TFTs.

Then, the silicon nitride film 110 and the dummy gate regions 108, 109 are removed, thus obtaining the state shown in FIG. 6(E). As shown in FIG. 7(A), an aluminum film 122 which will form gate electrodes is formed. The aluminum film 122 is patterned to form the gate electrodes 123 and 128, as shown in FIG. 7(B).

Figure 7B:
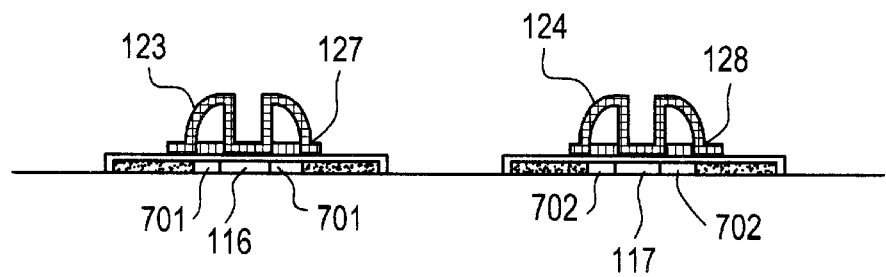

In the state shown in FIG. 7(B), those regions of the gate electrodes 123 and 124 which act substantially as gate electrodes are in contact with the bottoms of recesses 125 and 126 formed by the spacers 112 and 113, respectively. Those regions of the active layers which correspond to the bottoms of the recesses 125 and 126 formed by the spacers 112 and 113 form channel formation regions 116 and 117, respectively. Regions 701 and 702 become offset regions.

Figure 7C:
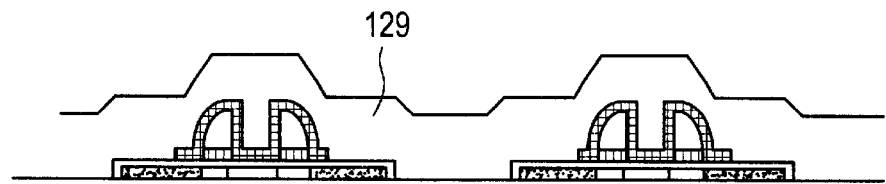
Figure 7D:
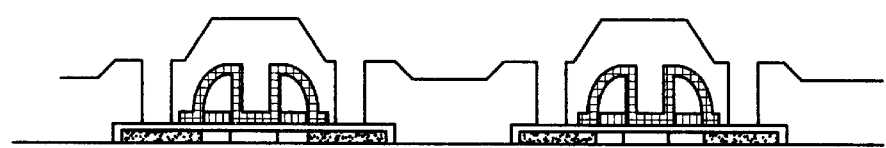
Figure 8A:
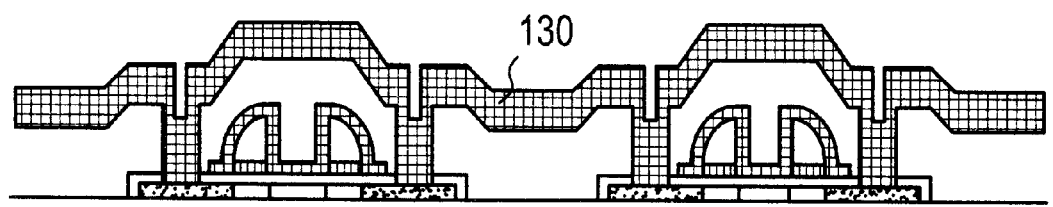
FIGS. 8(A)–8(B) are cross sections illustrating manufacturing steps of Example 2, for fabricating TFTs.
Figure 8B:
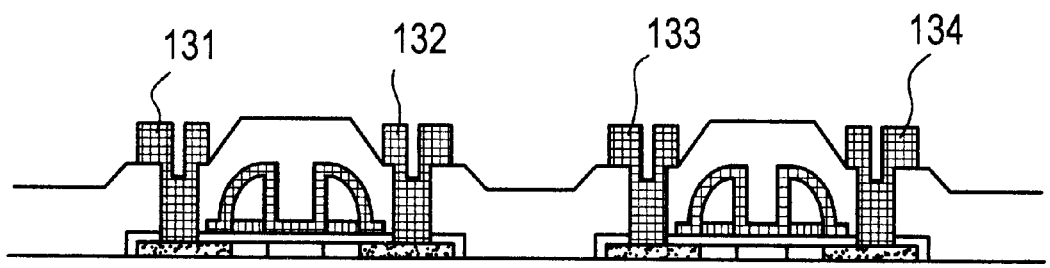

A silicon oxide film 129 forming an interlayer dielectric film is formed, as shown in FIG. 7(C). Contact holes are formed, as shown in FIG. 7(D). As shown in FIG. 8(A), an aluminum film 130 is formed to create electrodes. The film is patterned to form a source electrode 131 and a drain electrode 132 for the left N-channel TFT and a source electrode 133 and a drain electrode 134 for the right P-channel TFT. In this manner, the left N-channel TFT and the right P-channel TFT are completed, as shown in FIG. 8(B).

At least one of the following advantages can be obtained by utilizing the present invention.

(i) Insulated-gate field-effect transistors which permit large scales of integration and have high electrical characteristics can be obtained by using gate electrodes consisting only or mainly of aluminum that is a material of low resistivity.

(ii) Insulated-gate field-effect transistors which have offset regions or lightly doped drain (LDD) regions and low OFF currents can be obtained. These insulated-gate field-effect transistors are further characterized in that when a reverse bias gate voltage is applied, only a small electrical current flows between the drain and the source of each transistor.

(iii) Insulated-gate field-effect transistors having source/drain regions which can be annealed at a high temperature during formation of the source/drain regions can be obtained. These insulated-gate field-effect transistors are characterized in that they have high electrical characteristics and differ only a little in characteristics.

(iv) Offset regions or lightly doped regions, channel formation regions, source/drain regions, and gate electrodes can be formed in a self-alignment manner. Therefore, the device design margin and the process margin set during device fabrication can be made wide.

What is claimed is:

1. A method of manufacturing a semiconductor device comprising the steps of:

forming a semiconductor layer over a substrate;

forming a convex region comprising polysilicon or a silicide over said semiconductor layer;

implanting an impurity of a first concentration in said semiconductor layer by using said convex region as a mask;

forming spacers comprising an insulator on side surfaces of said convex region;

implanting an impurity of a second concentration in said semiconductor layer by using said convex region and said spacers as a mask;

annealing said semiconductor layer thereby activating said impurities of said first and second concentrations, after completion of said implanting of said impurities of first and second concentrations;

removing said convex region; and forming a gate electrode comprising a metal after said annealing in a region defined by said spacers.

2. A method of manufacturing a semiconductor device comprising the steps of:

forming an active layer or active region having a gate-insulating film thereon;

forming a convex region comprising polysilicon or a silicide over said gate-insulating film;

forming spacers comprising an insulator on side surfaces of said convex region;

implanting impurity ions into said active layer or active region, using said convex region and said spacers as a mask;

performing a heat treatment after completion of said implanting of impurity ions;

removing said convex region; and forming a gate electrode comprising aluminum in a region defined by said spacers after said heat treatment.

3. A method of manufacturing a semiconductor device comprising the steps of:

forming an active layer or active regions having a gate-insulating film thereon;

forming a convex region comprising polysilicon or a silicide over said gate-insulating film;

forming spacers comprising an insulator on side surfaces of said convex region;

implanting impurity ions into said active layer or active region, using said convex region and said spacers as a mask;

performing a heat treatment to anneal said active layer or active regions after completion of implanting said impurity ions;

removing said convex region; and forming a gate electrode comprising aluminum in a region defined by said spacers after said heat treatment, wherein said heat treatment prior to formation of said gate electrode is conducted at such a high temperature that said gate electrode would be damaged if said gate electrode was exposed to said high temperature.

4. The method according to claim 2 wherein said active layer comprises polysilicon.

5. The method of claim 2, wherein said heat treatment is performed at a temperature which is higher than 600° C. and lower than melting point of silicon, and wherein said gate electrode comprises aluminum.

6. The method of claim 2, wherein said gate electrode comprises a material which can not withstand a temperature used during said heat treatment.

7. A method of manufacturing a semiconductor device comprising the steps of:

forming a non-single crystalline semiconductor film over a substrate;

forming a gate insulating film over said semiconductor film;

forming a dummy electrode comprising polysilicon or a silicide over said gate insulating film;

forming side wall spacers comprising an insulating material on side surfaces of said dummy gate electrode;

introducing ions of an impurity into portions of said semiconductor film with said dummy gate electrode and said side wall spacers used as a mask;

annealing said semiconductor film after completion of said introduction of said impurity thereby activating said impurity;

etching said dummy electrode after said annealing whereby a groove is formed between said side wall spacers over said gate insulating film;

forming a conductive film comprising aluminum;

etching said conductive film comprising aluminum thereby forming a gate electrode within said groove;

wherein said heat treatment prior to formation of said gate electrode comprising aluminum is conducted at such a high temperature that said gate electrode would be damaged if said gate electrode was exposed to said high temperature.

8. A method of manufacturing a semiconductor device comprising the following sequential steps of:

forming a non-single crystalline semiconductor film over a substrate;

forming a gate insulating film over said semiconductor film;

forming a dummy electron over said gate insulating film;

introducing ions of a first impurity into said semiconductor film with said dummy electrode used as a first mask at a first concentration;

forming side wall spacers comprising an insulating material on side surfaces of said dummy electrode;

introducing ions of a second impurity into portions of said semiconductor film with said dummy electrode and said side wall spacers used as a second mask at a second concentration larger than said first concentration, thereby, forming lightly doped regions below said side wall spacers;

annealing said semiconductor film after completion of said introduction of said first and second impurities thereby activating said impurities; and then replacing said dummy electrode with a gate electrode comprising aluminum, wherein said annealing step prior to formation of said gate electrode comprising aluminum is carried out at such a condition that said gate electrode would be damaged if said gate electrode was exposed to said high temperature.

9. A method according to claim 8 wherein said non-single crystalline semiconductor film comprises polysilicon.

10. The method of claim 3, wherein said heat treatment is performed at a temperature which is higher than 600° C. and lower than melting point of silicon.

11. A method according to claim 1 wherein said semiconductor layer comprises polysilicon.

12. A method according to claim 3 wherein said active layer comprises polysilicon.

13. A method according to claim 7 wherein said non-single crystalline semiconductor film comprises polysilicon.

* * * * *